United States Patent
Rafferty et al.

(10) Patent No.: US 7,589,380 B2
(45) Date of Patent: Sep. 15, 2009

(54) METHOD FOR FORMING INTEGRATED CIRCUIT UTILIZING DUAL SEMICONDUCTORS

(75) Inventors: Conor S. Rafferty, Newton, MA (US); Clifford King, Gloucester, MA (US)

(73) Assignee: Noble Peak Vision Corp., Wakefield, MA (US)

( * ) Notice: Subject to any disclaimer, the term of this patent is extended or adjusted under 35 U.S.C. 154(b) by 116 days.

(21) Appl. No.: 11/220,942

(22) Filed: Sep. 7, 2005

(65) Prior Publication Data

US 2006/0049409 A1    Mar. 9, 2006

Related U.S. Application Data

(60) Provisional application No. 60/607,901, filed on Sep. 7, 2004.

(51) Int. Cl.
H01L 29/94 (2006.01)

(52) U.S. Cl. .......................... 257/347; 257/351

(58) Field of Classification Search ................ 257/338, 257/357, 369, 347–354
See application file for complete search history.

(56) References Cited

U.S. PATENT DOCUMENTS

| | | | |
|---|---|---|---|
| 4,038,680 A | 7/1977 | Yogi et al. | |
| 4,952,526 A | 8/1990 | Pribat et al. | |
| 5,120,666 A | 6/1992 | Gotou | |
| 5,467,204 A | 11/1995 | Hatano et al. | |
| 5,770,483 A * | 6/1998 | Kadosh et al. | 438/152 |
| 5,838,047 A * | 11/1998 | Yamauchi et al. | 257/372 |
| 6,287,903 B1 | 9/2001 | Okuno et al. | |
| 6,455,360 B1 | 9/2002 | Miyasaka | |
| 6,900,499 B2 | 5/2005 | Yamazaki et al. | |
| 7,012,314 B2 | 3/2006 | Bude et al. | |
| 2003/0027409 A1 | 2/2003 | Ramdani et al. | |
| 2003/0057439 A1 | 3/2003 | Fitzgerald | |
| 2003/0207127 A1 | 11/2003 | Murthy et al. | |
| 2004/0026765 A1 | 2/2004 | Currie et al. | |
| 2004/0029325 A1 | 2/2004 | Le Goascoz et al. | |
| 2004/0106268 A1 | 6/2004 | Shaheen et al. | |
| 2004/0222463 A1 | 11/2004 | Yeo et al. | |
| 2005/0093028 A1 | 5/2005 | Chambers | |
| 2005/0099839 A1* | 5/2005 | Bhattacharyya | 365/149 |

FOREIGN PATENT DOCUMENTS

| | | |
|---|---|---|
| JP | 6191917 | 5/1986 |
| JP | 223224 | 8/2001 |

OTHER PUBLICATIONS

International Search Report mailed Feb. 12, 2008 from the International Searching Authority for International Application No. PCT/US 06/32272.

Written Opinion mailed Feb. 12, 2008 from the International Searching Authority for International Application No. PCT/US 06/32272.

* cited by examiner

*Primary Examiner*—Richard A. Booth
(74) *Attorney, Agent, or Firm*—Wolf, Greenfield & Sacks, P.C.

(57) ABSTRACT

A monolithically integrated electronic circuit using two different semiconductor layers which are separated by a dielectric layer. Transistors formed in the upper semiconductor layer are connected to transistors formed in the lower semiconductor layer via conventional wiring. Preferably, one layer of transistors is of one polarity, N-type or P-type, while the second layer of transistors is of the opposite polarity.

18 Claims, 6 Drawing Sheets

METHOD FOR FORMING INTEGRATED CIRCUIT UTILIZING DUAL SEMICONDUCTORS

RELATED APPLICATIONS

The present application is related to, and claims priority from, U.S. Provisional Application Ser. No. 60/607,901 of the same title by C. King and C. Rafferty, filed on Sep. 7, 2004 and which is herein incorporated by reference. The present application also incorporates by reference U.S. application Ser. No. 10/453,037 by J. Bude et al., filed on Jun. 3, 2003 ("Semiconductor Devices With Reduced Active Region Defects and Unique Contacting Schemes"), now issued as U.S. Pat. No. 7,012,314, and U.S. Provisional Application Ser. No. 60/434,359 filed on Dec. 18, 2002.

STATEMENT REGARDING FEDERALLY SPONSORED RESEARCH

Not Applicable.

BACKGROUND OF THE INVENTION

The present invention relates generally to methods for forming integrated electronic circuits, and in particular, to methods for forming MOS circuits using plural overlapping layers of different semiconductor materials.

Silicon integrated circuits "IC's" are ubiquitous in modern electronics. These integrated electronic circuits, which contain up to millions of transistors, can be formed simultaneously by a series of process steps using masks containing millions of features. Silicon IC technology has led to an explosion of such electronic devices as computers, handheld telephones, portable music and movie players.

Ever more sophisticated and powerful appliances are enabled by increasing the density and speed of silicon IC technology, as well as by decreasing the cost. Continuing to increase the speed and density of integrated circuits is becoming an ever greater challenge. Much of the last twenty years of silicon scaling has proceeded by reducing the lateral dimensions on the masks and proportionally reducing the thickness of the various layers of the circuit. However, the current gate oxide layer in a conventional metal-oxide-silicon ("MOS") transistor is no more than a few atoms thick, and the lateral dimensions which must be patterned by lithography are now less than the wavelength of the light used to illuminate them. Further scaling is proving to be increasingly difficult, and alternate approaches to increasing the density and speed of integrated electronic circuits are desired.

One technique of increasing speed in modern transistors is to improve the mobility of carriers by introducing strain. Strain can be introduced by a variety of processing techniques, such as the deposition of dielectric layers with high intrinsic strain, or the growth of silicon layers on a template material which has a different lattice constant, such as silicon-germanium. By judicious choice of materials, a particular strain state can be built into a transistor and can enhance the mobility of carriers therein. An alternative approach uses different crystal orientations to optimize the mobility of holes and electrons separately. By bonding silicon islands of one crystal orientation to a silicon wafer of a different orientation, the mobility of holes can be enhanced without adversely affecting the mobility of electrons.

Each of these examples continues to use silicon as the semiconductor in which the transistors are formed. Silicon has been the preferred material for integrated electronic circuits, primarily because it has a high-quality native oxide. However, the advent of high-dielectric constant ("high-K") gate insulators provides a new opportunity to consider semiconductors other than silicon for future ultra-scaled metal-oxide-semiconductor field effect transistors (MOSFETs). For example, germanium is a semiconductor in the same chemical family as silicon. The process chemistry of germanium is fully compatible with silicon and is already used today as a dilute additive in silicon processes to enhance transistor performance.

Considerable efforts have been made to grow germanium transistor material on silicon. However, the growth of pure germanium on a silicon substrate is difficult, due to the large lattice mismatch (4%) between the silicon and germanium crystals. Many techniques have been proposed by others to grow pure germanium on silicon, but they have produced highly defective material which is not of electronic interest.

BRIEF SUMMARY OF THE INVENTION

The present invention provides a monolithically integrated electronic circuit using at least two different semiconductor layers which are separated by a dielectric layer. Transistors formed on a first layer "the lower semiconductor layer" are created before the second "upper" semiconductor layer is grown. The upper crystalline layer is formed by epitaxy from seeds using the substrate as a template. Transistors are then created in the upper semiconductor layer. The two layers of transistors can be interconnected using conventional wiring techniques. Preferably, one layer of transistors is of one carrier polarity, N-type or P-type, while the second layer of transistors is of the opposite polarity.

In an advantageous embodiment of the present invention, the first semiconductor layer is a single-crystal silicon substrate and the second semiconductor layer is a single-crystal island of germanium grown from a germanium seed epitaxially grown from the silicon. By appropriate dimensioning of the seed and the island, a substantially defect-free island can be provided. Thus standard silicon IC processing can be adapted to produce germanium transistors overlying silicon transistors. After depositing a high-K dielectric, the germanium transistors can be wired together using the same basic process and equipment used for silicon-based technology. Moreover, plural layers of transistors can be created on the same silicon substrate, essentially multiplying the integrated circuit device density and improving the speed of the resulting circuits.

BRIEF DESCRIPTION OF THE SEVERAL VIEWS OF THE DRAWINGS

The foregoing features, and advantages of the invention, as well as presently preferred embodiments thereof, will become more apparent from the following description and the accompanying drawings.

In the drawings.

Corresponding reference numerals indicate corresponding parts throughout the drawings. It is to be understood that the drawings are for illustrating the concepts of the invention and are not to scale.

DESCRIPTION OF THE PREFERRED EMBODIMENT

This detailed description illustrates the invention by way of example and not by way of limitation. The description enables one skilled in the art to make and use the invention, and describes several embodiments, adaptations, variations, alternatives, and uses of the invention, including what is presently believed to be the best mode of carrying out the invention.

Figure 1:
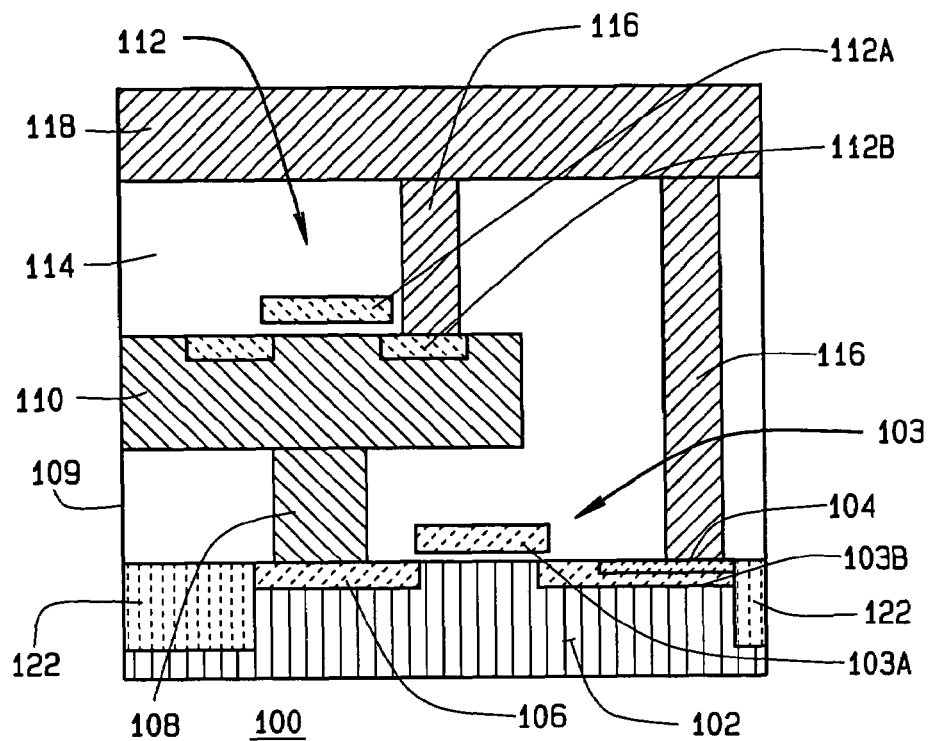
FIG. 1 is a cross-sectional view of a two-layer semiconductor of the present invention.

Turning to the drawings, FIG. 1 shows a cross-section of a portion of an integrated circuit 100 having two overlapping semiconductor layers. The circuit is formed on a silicon substrate 102 and can be processed using steps similar to conventional flow-through source-drain formation. Advantageously, N-type transistors 103 having gates 103A, drains 103B, and sources 106 are created in the P-type silicon substrate. N-wells are usually unnecessary. If the process uses a self-aligned silicided layer (salicide) 104, a salicide-block mask 106 is used over the N-type junctions where a seed 108 for a second semiconductor layer of germanium is later to be formed.

A first dielectric layer 109 is deposited over the silicon substrate 102 and transistors 103 and it is planarized, then germanium islands 110 are formed by epitaxy lateral overgrowth (ELO) from seeds 108 using the substrate as a template. The ELO technique is used to form a high quality germanium seed 108 embedded in the insulator 109 formed on top of the silicon substrate 102. As an example, insulator 109 is formed as an oxide layer overlying a single crystal silicon substrate 102. Seed windows are lithographically defined in the oxide and opened by etching down to the substrate. The exposed silicon surface is cleaned for germanium growth. Then, germanium is grown selectively on the exposed silicon by selective CVD growth. The growth is continued until the germanium overgrows the seed window and fills the region of the island 110. The seeds and islands are shaped and dimensioned so that defects originating at the Ge/Si interface are terminated at the seed walls before reaching the germanium island. This provides a region of germanium 110 over the oxide mask that is essentially defect-free and is sufficiently large to form a germanium MOS transistor. Further details concerning this technique are set forth in U.S. Patent Application Publication No. 2004/0121507 A1 to Bude et al., herein incorporated by reference.

The seeds 108 of the germanium islands 110 are advantageously arranged to fall over N-type doping so that each island has a body tie. However, this is not an essential feature, as the body tie may also be created with an N-type implant and a contact from above. The seed 108 lying over N-type doping permits a closer overlap of N-type germanium islands 110 with transistors 103 in the substrate 102.

After formation of the germanium islands 110, germanium P-type transistors 112 having gates 112A, drains 112B, and sources 112C are created in the germanium island 110 using steps familiar to those skilled in the art. Germanium processing temperatures are lower than silicon processing temperatures, hence, by forming the germanium layer after the silicon transistors have been created, the characteristics of both transistor types can be independently optimized without affecting one another. Following the creation of germanium transistors 112, a second dielectric layer 114 is deposited. Via holes are etched through the dielectric layers 114, 109 to the silicon layer 102 and to the germanium layer 110, and metal contacts 116 from a metal connector 118 to both types of transistors 103, 112 are formed, using methods familiar to those skilled in the art of MOS processing.

With the N-type transistors 103 created in the silicon level 102, and the P-type transistors 112 created in the germanium layer 110, the P-type transistors 112 can be as fast as the N-type transistor 103, and their sizes may be equal. In contrast, in a conventional silicon-only layout, the P-type transistors must be twice as large as the N-type transistors to compensate for holes in silicon being slower than electrons.

Figure 2:
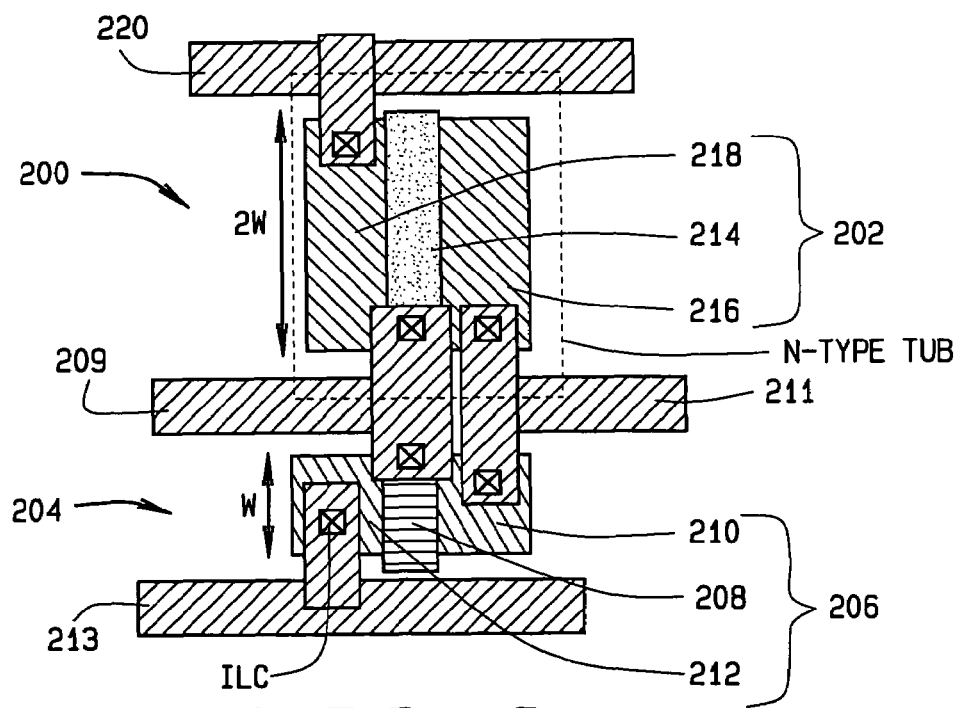
FIG. 2 illustrates the layout of a prior art inverter integrated circuit.

The advantages in circuit density achieved by the present invention are best described by comparison to conventional CMOS layouts. FIG. 2 illustrates a conventionally formed inverter integrated circuit, and FIG. 3 illustrates a conventionally formed NAND gate integrated circuit.

In FIG. 2, a N-type tub 200 containing one or more PMOS transistor devices 202 is located near a P-type tub 204 containing a matching number of NMOS transistor devices 206. The N-type tub 200 has a width 2W which is typically about twice the width W of the P-type tub 204 to allow the drive of the PMOS transistors 202 to match the drive of the NMOS transistors 206. Space must be allowed to provide for proper isolation between the P-type tub 204 and the N-type tub 200, to avoid leakage and latchup. In the case of the inverter integrated circuit, the NMOS transistor 206 comprises a single N-polysilicon gate 208, coupled via an inter-layer contact (ILC) to the input line 209, which separates the N-drain 210 linked to the metal output line 211 from the N-source 212 linked to the metal ground 213. Similarly, for the PMOS device 202, a single P-polysilicon gate 214 is coupled to the input line 209, and separates the P-drain 216, linked to the metal output line 211, from the P-source 218 linked to the metal power line 220.

Figure 3:
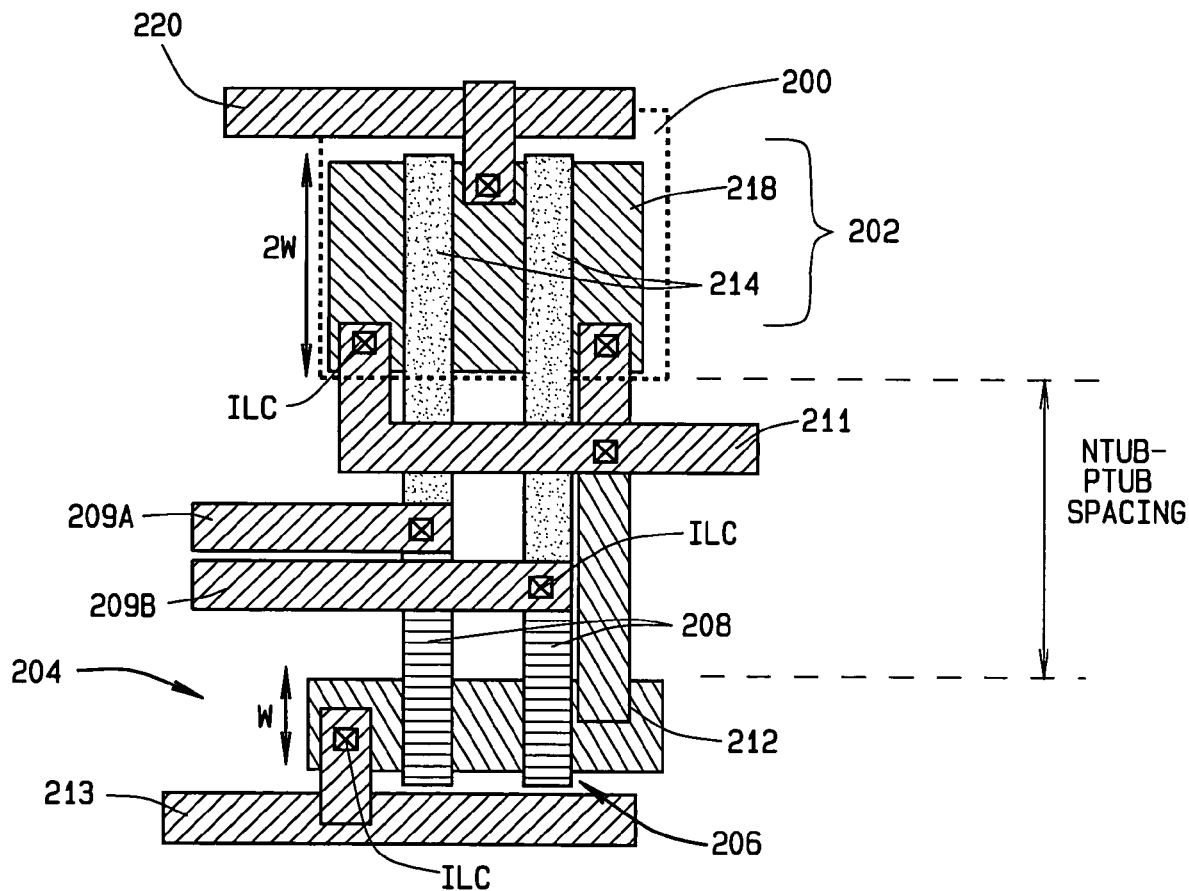
FIG. 3 illustrates the layout of a prior art 2-input NAND gate integrated circuit.

In the case of the conventional NAND gate integrated circuit shown in FIG. 3, two N-polysilicon gates 208 divide the P-type tub 204 into two series connected NMOS transistors 206, while two P-polysilicon gates 214 divide the N-type tub 200 into two parallel connected PMOS transistors 202, providing the correct logic function of a NAND gate having two inputs 209A and 209B. Other conventional gates and integrated electronic circuits are laid out in similar fashion.

Figure 4:
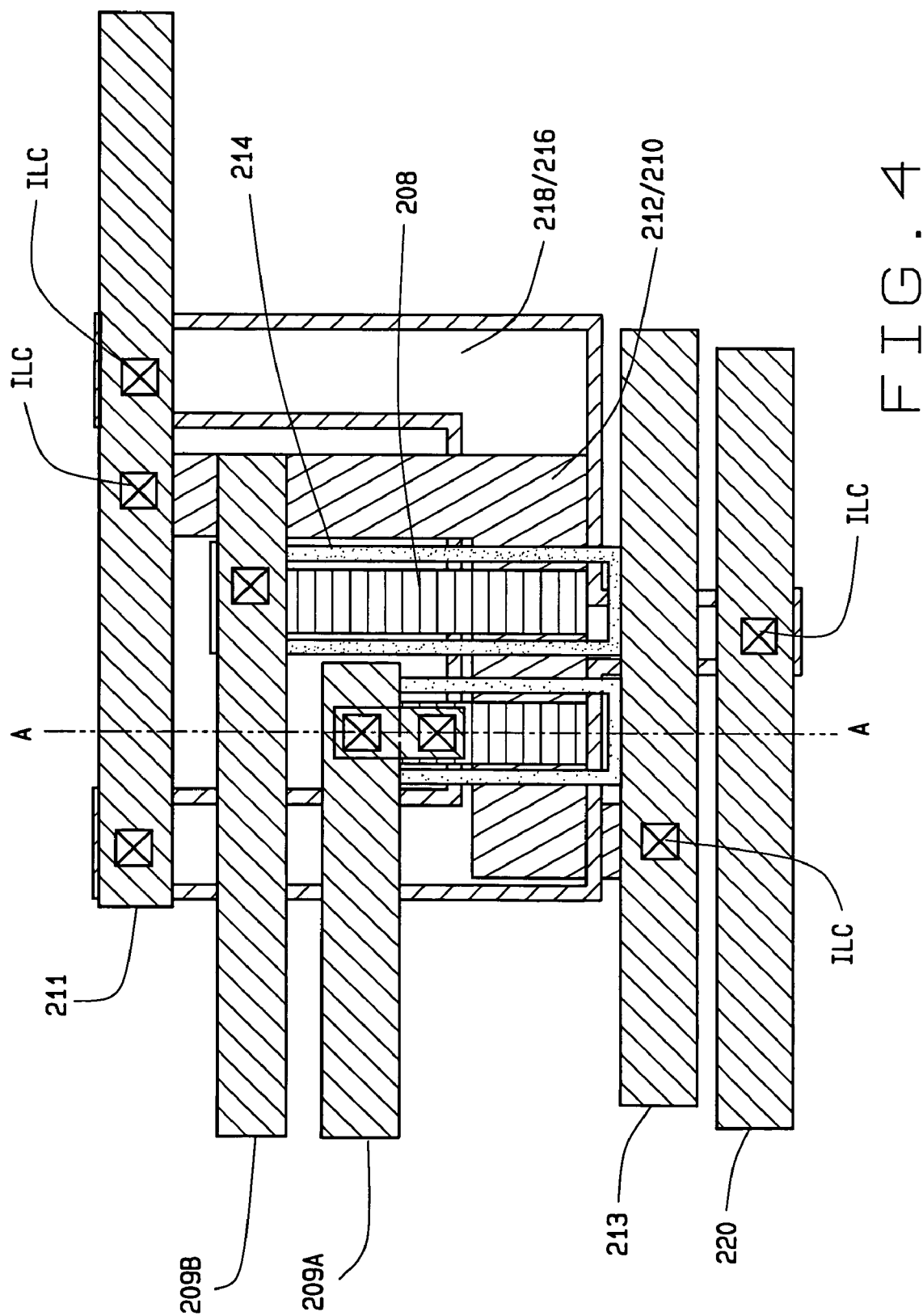
FIG. 4 illustrates a partially cutaway layout of an inverter integrated circuit formed using the two-layer semiconductor of the present invention.
Figure 5:
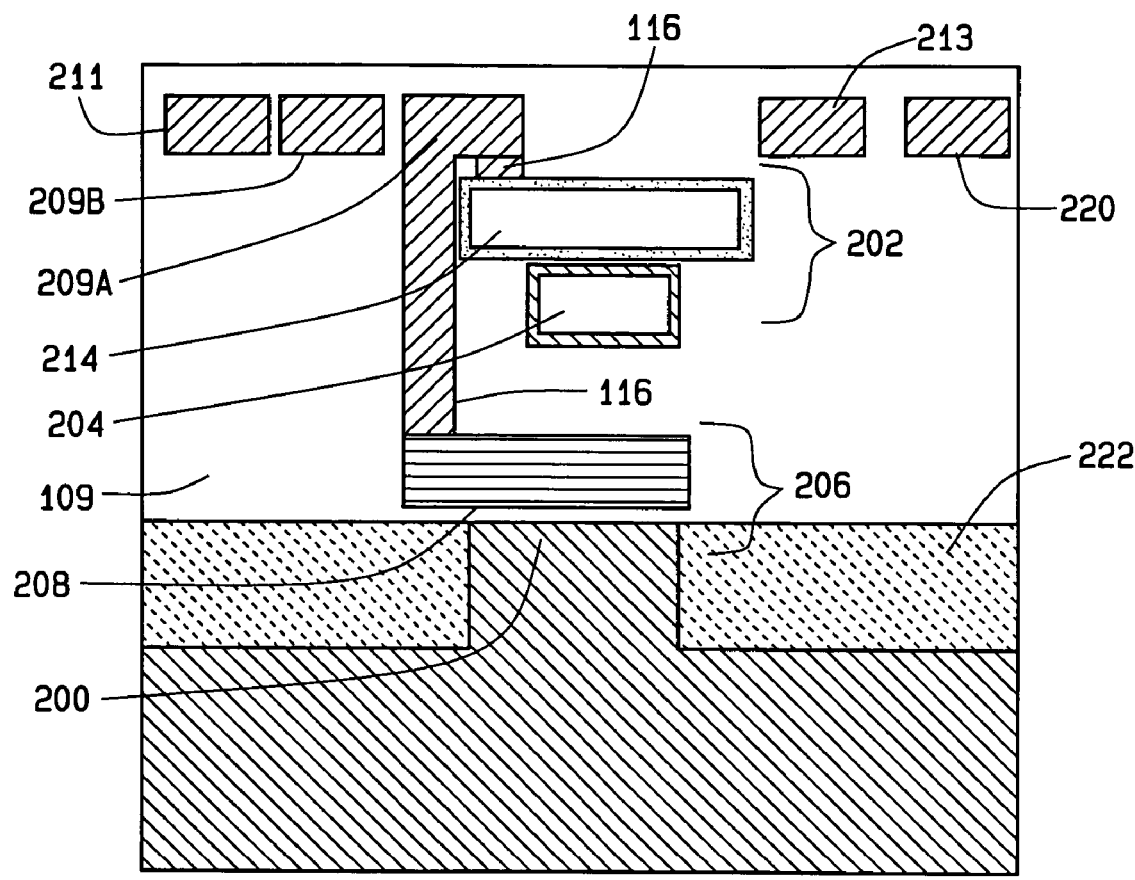
FIG. 5 illustrates a cross-sectional view of FIG. 4 along line A-A.

FIG. 4 shows a layout of a NAND gate formed using the two semiconductor layering method of the present invention. If there are no constraints on the formation of the second semiconductor layer 110, the N-type tub 204 is advantageously placed directly over the P-type tub 200 and the PMOS gate 214 over the NMOS gate 208. The P-type tub 200 is s-shaped in this layout and the N-type tub 204 is shaped like a tuning fork. The P-type tub 200 and the N-type tub 204 are divided by the polysilicon gate 208 and poly-germanium gate 214, respectively, similar to the planar layout. A cross-section through the structure of FIG. 4, taken along line A-A is shown in FIG. 5. The P-type transistor 202 is above the N-type transistor 206, and the gates 208, 214 are stacked, with the surrounding space filled with the dielectric material 109.

Figure 6:
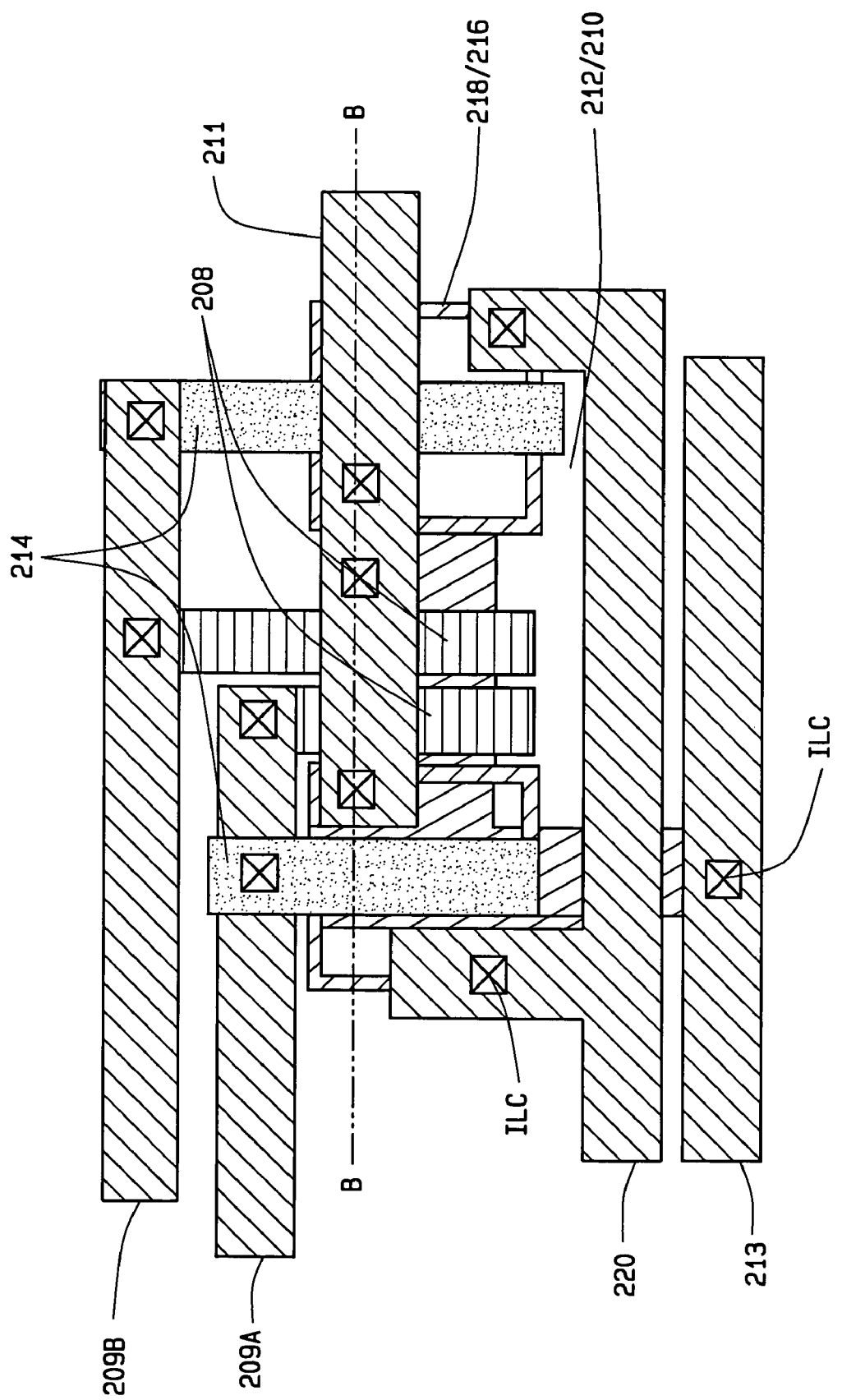
FIG. 6 illustrates a partially cutaway alternate layout of an inverter integrated circuit formed using the two-layer semiconductor of the present invention.
Figure 7:
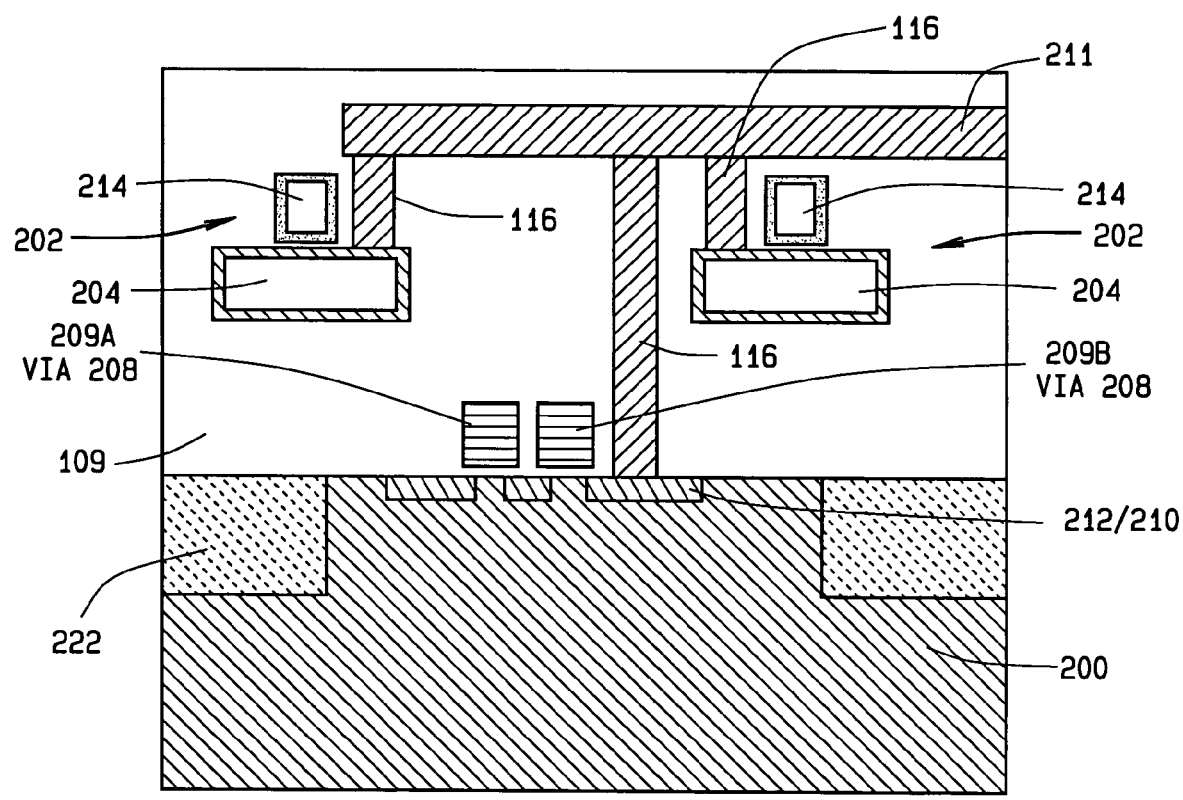
FIG. 7 illustrates a cross-sectional view of FIG. 6 along line B-B.

In FIG. 6, an alternative layout is shown. This layout takes into account constraints on a particular growth technique. Referring again to FIG. 1, if the growth method disclosed in the '507 Bude et al. Published Patent Application is used, an opening (seed) 108 to the substrate 102 should be opened in order to provide a template for the germanium island 110. The germanium island 110 is most easily formed if it is square and if the substrate opening (seed) 108 is near the center of the square. The seed opening 108 therefore is not above the polysilicon or trench isolation 222, and is advantageously over the exposed substrate 102. If a P-type device 202 is to be formed in germanium, it is convenient to use an N-type section of substrate 102 to provide an N-type body contact for the germanium transistor 202. Two separate squares of germanium are used, one for each PMOS transistor 202. FIG. 7 illustrates a cross-section of the layout shown in FIG. 6, taken along the line B-B.

As is readily apparent from the figures, the two layouts utilizing a double semiconductor layering of the present invention are much more compact than the corresponding conventional layering layouts where all the transistors are in a single plane. No extra spacing to separate the P-type tub 204 and the N-type tub 200 is required. The PMOS devices 202 do not need to be any wider than the NMOS devices 206 because they are created in the germanium layer which has a higher mobility than the silicon substrate for both carriers.

Although the invention has been shown and described with respect to a silicon substrate, a silicon-on-insulator (SOI) substrate, a silicon-carbide substrate, or other silicon-based substrates may be used without departing from the scope of the present invention. Although the described formation of the germanium layer is by epitaxial lateral overgrowth, other epitaxial layer formation techniques, for instance liquid-phase epitaxy (LPE) or wafer bonding may be used. Moreover, rather than pure germanium, other alloys of silicon-germanium and other semiconductors may be used, provided that (a) their chemistry is compatible with silicon; (b) they may be epitaxially grown from a silicon seed; and (c) their processing temperatures allow transistors to be created without destroying the silicon transistors in the substrate.

Although the invention has been shown and described with respect to having P-type transistors 202 in the germanium layer and N-type transistors 206 in the silicon layer, any combination of transistor polarities may be used and will still gain an advantage in packing density.

It is also possible to make a device having three or more layers of semiconductor transistors, as by using the process described above to epitaxially grow yet a third layer of semiconductor overling the germanium islands, and forming transistors by a process compatible with those previously formed. Preferably, the semiconductor material of the first layer is silicon, the second layer is silicon-germanium, and the third layer is germanium. Alteration of the semiconductor layer conductivity types (NPN or PNP). would provide the desired isolation.

In summary, a method of the present invention provides for the formation of an integrated circuit using at least two different semiconductor layers which are separated by dielectric layers. An upper layer is formed of a semiconductor which can be processed at a lower temperature than the lower layer. Transistors on the lower layer are created before the upper layer is grown, by epitaxy, using the substrate as a template. Transistors are then created in the upper layer. The two layers are interconnected using conventional wiring techniques. Preferably, one layer of transistors is of one carrier polarity, N-type or P-type, while each adjacent layer is of the opposite carrier polarity.

In view of the above, it will be seen that advantageous results are obtained. As various changes could be made in the above constructions without departing from the scope of the invention, it is intended that all matter contained in the above description or shown in the accompanying drawings shall be interpreted as illustrative and not in a limiting sense.

The invention claimed is:

1. An electronic integrated circuit, comprising:
    a first single-crystal semiconductor layer comprising silicon and having a first processing temperature, the first-single crystal semiconductor layer comprising at least one transistor formed therein;
    a second single-crystal semiconductor layer comprising a germanium alloy and having a second processing temperature, the second-single crystal semiconductor layer overlapping the first single-crystal semiconductor layer and comprising at least one transistor formed therein;
    a layer of substantially pure germanium having a third processing temperature, the layer of substantially pure germanium overlapping the first and second single-crystal semiconductor layers;
    wherein the third processing temperature is lower than the second processing temperature;
    wherein the second processing temperature is lower than the first processing temperature; and
    wherein the first single-crystal semiconductor layer and the second single-crystal semiconductor layer are monolithically integrated.

2. The electronic integrated circuit of claim 1 wherein the layer of substantially pure germanium is grown from at least one germanium seed element, the germanium seed element grown epitaxially from said second single-crystal semiconductor layer.

3. The electronic integrated circuit of claim 1 wherein a majority of devices of one polarity are formed in said first single-crystal semiconductor layer, and a majority of devices of an opposite polarity are formed in said second single-crystal semiconductor layer.

4. An electronic integrated circuit, comprising:
    a first semiconductor layer comprising a first semiconductor material, the first semiconductor layer having at least one transistor;
    a layer of substantially pure germanium having at least one transistor; and
    an insulating layer intermediate the first semiconductor layer and the layer of substantially pure germanium and at least partially separating the first semiconductor layer and the layer of substantially pure germanium;
    wherein the layer of substantially pure germanium is integrated with the first semiconductor layer by growth from at least one germanium seed element, the at least one germanium seed element epitaxially grown from the first semiconductor layer at least partially through the insulating layer;
    wherein said at least one transistor in said first semiconductor layer and said at least one transistor in said layer of substantially pure germanium are of opposite polarity.

5. The electronic integrated circuit of claim 4 wherein the at least one transistor in the layer of substantially pure germanium is a P-type transistor.

6. The electronic integrated circuit of claim 4 wherein said first semiconductor material comprises silicon and said at least one transistor in said first semiconductor layer is an N-type transistor.

7. The electronic integrated circuit of claim 6 wherein said at least one transistor in said layer of substantially pure germanium is a P-type transistor.

8. The electronic integrated circuit of claim 7 wherein said N-type transistor has a first speed and said P-type transistor has a second speed, and wherein the first speed and the second speed are substantially the same.

9. The electronic integrated circuit of claim 7 wherein said N-type transistor and said P-type transistor have substantially the same surface areas and speeds.

10. An electronic integrated circuit, comprising:
a first semiconductor layer comprising a first semiconductor material, the first semiconductor layer having at least one transistor;
a second semiconductor layer comprising a second semiconductor material, the second semiconductor layer having at least one transistor;
a first insulating layer intermediate said first and second semiconductor layers;
a layer of substantially pure germanium having at least one transistor; and
a second insulating layer intermediate the second semiconductor layer and the layer of substantially pure germanium;
wherein the second semiconductor layer is integrated with the first semiconductor layer by growth from at least one seed element of the second semiconductor material, the seed element epitaxially grown from the first semiconductor layer at least partially through the first insulating layer;
wherein said layer of substantially pure germanium is integrated with said second semiconductor layer by growth from at least one germanium seed element, said at least one germanium seed element epitaxially grown from said second semiconductor layer at least partially through said second insulating layer.

11. The electronic integrated circuit of claim 1, wherein the at least one transistor of the first single-crystal semiconductor layer is connected to the at least one transistor of the second single-crystal semiconductor layer.

12. The electronic integrated circuit of claim 1, wherein the layer of substantially pure germanium comprises at least one transistor formed therein.

13. The electronic integrated circuit of claim 12, wherein the at least one transistor of the layer of substantially pure germanium is connected to the at least one transistor of the second single-crystal semiconductor layer.

14. The electronic integrated circuit of claim 12, wherein the at least one transistor of the layer of substantially pure germanium is connected to the at least one transistor of the first single-crystal semiconductor layer.

15. The electronic integrated circuit of claim 7, wherein the at least one transistor of the first semiconductor layer is connected to the at least one transistor of the layer of substantially pure germanium.

16. The electronic integrated circuit of claim 10, wherein the at least one transistor of the first semiconductor layer is connected to the at least one transistor of the second semiconductor layer.

17. The electronic integrated circuit of claim 10, wherein the at least one transistor of the second semiconductor layer is connected to the at least one transistor of the layer of substantially pure germanium.

18. The electronic integrated circuit of claim 10, wherein the at least one transistor of the first semiconductor layer is connected to the at least one transistor of the layer of substantially pure germanium.

* * * * *

UNITED STATES PATENT AND TRADEMARK OFFICE
CERTIFICATE OF CORRECTION

PATENT NO.        : 7,589,380 B2                                    Page 1 of 1
APPLICATION NO.   : 11/220942
DATED             : September 15, 2009
INVENTOR(S)       : Rafferty et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 347 days.

Signed and Sealed this

Twenty-first Day of September, 2010

David J. Kappos
*Director of the United States Patent and Trademark Office*